US006939663B2

(12) United States Patent
Tao et al.

(10) Patent No.: US 6,939,663 B2
(45) Date of Patent: Sep. 6, 2005

(54) SULFATED PHENOLIC RESINS AND PRINTING PLATE PRECURSORS COMPRISING SULFATED PHENOLIC RESINS

(75) Inventors: Ting Tao, Fort Collins, CO (US); Scott A. Beckley, Windsor, CO (US); John Kalamen, Loveland, CO (US); Kevin Barry Ray, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 83 days.

(21) Appl. No.: 10/615,358

(22) Filed: Jul. 8, 2003

(65) Prior Publication Data

US 2005/0008965 A1 Jan. 13, 2005

(51) Int. Cl.[7] .......................... G03F 7/004; G03F 7/016

(52) U.S. Cl. ................. 430/270.1; 430/171; 430/278.1; 430/302; 430/309; 430/401; 430/434; 430/435; 430/494; 430/944; 430/945; 430/964

(58) Field of Search ........................... 430/270.1, 278.1, 430/302, 309, 401, 434, 435, 494, 944, 945, 964, 171

(56) References Cited

U.S. PATENT DOCUMENTS

| | | | | |
|---|---|---|---|---|
| 4,177,345 | A | | 12/1979 | Schweiger |
| 4,318,815 | A | | 3/1982 | Tyler |
| 4,708,925 | A | | 11/1987 | Newman |
| 5,061,401 | A | | 10/1991 | Wernet et al. |
| 5,073,442 | A | | 12/1991 | Knowlton et al. |
| 5,098,774 | A | | 3/1992 | Chang |
| 5,206,297 | A | | 4/1993 | Wernet et al. |
| 5,208,135 | A | | 5/1993 | Patel et al. |
| 5,229,483 | A | | 7/1993 | Fitzgerald |
| 5,340,699 | A | | 8/1994 | Haley et al. |
| 5,372,907 | A | | 12/1994 | Haley et al. |
| 5,382,382 | A | | 1/1995 | Asakura et al. |
| 5,427,715 | A | | 6/1995 | Ohwa et al. |
| 5,482,655 | A | | 1/1996 | Vogel et al. |
| 5,520,849 | A | | 5/1996 | Eiffler |
| 5,663,037 | A | | 9/1997 | Haley et al. |
| 5,750,656 | A | | 5/1998 | Myers |
| 5,919,601 | A | | 7/1999 | Nguyen et al. |
| 5,965,319 | A | | 10/1999 | Kobayashi |
| 6,017,677 | A | | 1/2000 | Maemoto et al. |
| 6,063,544 | A | | 5/2000 | Sheriff et al. |
| 6,136,503 | A | | 10/2000 | Zheng et al. |
| 6,140,022 | A | | 10/2000 | Van Damme et al. |
| 6,162,578 | A | * | 12/2000 | Zheng et al. ............ 430/270.1 |
| 6,406,829 | B1 | | 6/2002 | Tachikawa et al. |
| 6,413,694 | B1 | | 7/2002 | Zheng et al. |
| 6,448,435 | B1 | | 9/2002 | Jacobson et al. |
| 6,465,599 | B1 | | 10/2002 | Lamartine et al. |
| 6,550,387 | B1 | | 4/2003 | Vermeersch et al. |
| 2002/0048718 | A1 | | 4/2002 | Zheng et al. |
| 2002/0068241 | A1 | | 6/2002 | Oohashi et al. |

FOREIGN PATENT DOCUMENTS

| | | | | | |
|---|---|---|---|---|---|
| EP | 0 773 112 | B1 | | 5/2001 | |
| EP | 1 106 381 | A1 | | 6/2001 | |
| EP | 0 770 497 | B1 | | 4/2002 | |
| GB | 1 546 633 | | | 5/1979 | |
| JP | 57-102929 | | | 6/1982 | |
| JP | 61-136527 | | | 6/1986 | |
| WO | WO 01/96119 | A1 | * | 12/2001 | ............. B41C/1/10 |

OTHER PUBLICATIONS

Burstein, et al., "Kinetics and Mechanism of Solvolysis of Steroid Hydrogen Sulfates", *J. Am. Chem. Soc.*, vol. 80, Oct. 5, 1958, pp. 5235–5239.

Flanagin et al., "Mechanism of Phenolic Polymer Dissolution: Importance of Acid–Base Equilibria", © 1999 American Chemical Society, *Macromolecules*, vol. 32, 1999, pp. 5337–5343.

Kice et al., "The Mechanism of the Acid Hydrolysis of Sodium Aryl Sulfates", *J. Am. Chem. Soc.*, vol. 88, 1966, pp. 5242–5244.

Foster, "Sulfonation and Sulfation Processes", ©1997 The Chemithon Corporation, pp. 1–37.

Oswald et al., "Novel Diode Laser–compatible Fluorophores and Their Application to Single Molecule Detection, Protein Labeling and Fluorescence Resonance Energy Transfer Immunoassay", *Photochemistry and Photobiology*, vol. 74(2), 2001, pp. 237–245.

Li et al., "Synthesis and Characterization of Heptamethine Cyanine Dyes", ©1997 MDPI, *Molecules*, vol. 2, 1997, pp. 91–98.

Flanagan, Jr., et al., "Functionalized Tricarbocyanine Dyes as Near–Infrared Fluorescent Probes for Biomolecules", © 1997 American Chemical Society, *Bioconjugate Chem.* vol. 8 1997, pp. 751–756.

(Continued)

*Primary Examiner*—Barbara L. Gilliam
(74) *Attorney, Agent, or Firm*—Faegre & Benson LLP

(57) ABSTRACT

The present invention provides a thermally sensitive composition that may be coated as a water-borne material onto a substrate to yield a printing plate precursor having an imageable coating. The thermally sensitive composition comprises a sulfated phenolic resin. The sulfated phenolic resin may be a sulfated novolak resin or a sulfated resole resin, for example. The thermally sensitive composition may include a water-soluble binder, such as polyvinyl pyrrolidone, and a radiation-absorbing component. The invention also provides a printing plate precursor that is developed in water after imaging. The precursor does not require chemical development with a developing solution containing organic solvents or inorganic additives. The imaged precursor is on-press-developable when used with a fountain solution. Methods for making and using the precursor are also provided.

67 Claims, No Drawings

OTHER PUBLICATIONS

Kice et al., "The Mechanism of the Acid Hydrolysis of Bunte Salts (S–Alkyl and S–Aryl Thiosulfates)" J. Am. Chem. Soc., vol. 88, 1966, pp. 5245–5250.

Sobel et al., "Steryl Sulfates. I. Preparation and Properties", *J. Am. Chem. Soc.*, vol. 63, 1941, pp. 1259–1261.

Hardy et al., "Separation of Mixtures with Triethylamine—Sulfur Trioxide", *J. Am. Chem. Soc.*, vol. 74, 1952, pp. 5212–5214.

Opaprakasit, "Chapter 2, Preparation and Characterization of Phenolic Resins", A Thesis in Material Science and Engineering entitled "The Structure of Phenolic Copolymers as Models For Coal: Studies of Hydrogen Bonding", Dec. 1999, The Pennsylvania State University, The Graduate School Department of Material Science and Engineering.

Landesberg et al., "Norbornadien–7 oneiron Tricarbonyl", *J. Am. Chem. Soc.*, 90:6, Mar. 13, 1968, pp. 1655–1657.

* cited by examiner

SULFATED PHENOLIC RESINS AND PRINTING PLATE PRECURSORS COMPRISING SULFATED PHENOLIC RESINS

TECHNICAL FIELD

The present invention relates to sulfated phenolic resins, compositions comprising sulfated phenolic resins, and printing plate precursors having an imageable coating comprising a sulfated phenolic resin.

The art of lithographic printing is based on the immiscibility of oil and water. An imaged and developed printing plate has image areas and non-image areas defining the image to be printed. Lithographic printing often employs a dispersion of an oily ink in a dampening fountain solution, which is generally an aqueous solution that may include a surfactant or an organic solvent such as an alcohol or alcohol substitute. The image areas on a printing plate for use with a fountain solution/ink dispersion are ink-receptive or "oleophilic," and the non-image areas are water-receptive or "hydrophilic." In wet-on-press printing, when a printing plate is immersed in the fountain solution, ink is preferentially retained by image areas on the printing plate and non-image areas are preferentially dampened by the fountain solution.

Waterless printing plates (i.e., those not requiring the use of a fountain solution) are also known in the art of planographic printing. For waterless plates, the image areas on the printing plate are ink-receptive or "oleophilic," and the non-image areas are ink-repellent or "oleophobic."

For either wet-on-press or waterless printing, the ink on the image areas is then transferred to the surface of a material upon which the image is to be reproduced, such as paper, cloth or the like. Commonly the ink is transferred to an intermediate material called the "blanket," which in turn transfers the ink to the surface of the material upon which the image is reproduced.

A common type of lithographic printing plate precursor has a radiation-sensitive coating applied to a support such as an aluminum plate. Negative-working and positive-working printing plate precursors are available.

Negative-working lithographic printing plate precursors have a radiation-sensitive coating which, when imagewise exposed to imaging radiation, cures, hardens or becomes insoluble in the exposed areas. Upon development, the unexposed areas of the coating are removed, leaving the exposed areas which form an image.

Positive-working lithographic printing plate precursors have a radiation-sensitive coating which, after imagewise exposure to imaging radiation, becomes more soluble in a developer in the exposed areas than in the unexposed areas. This radiation-induced solubility differential is called photosolubilization. Upon development, the exposed areas of the coating are removed, leaving the unexposed areas which form an image. A number of commercially available positive-working printing plate precursors work by photosolubilization to produce an image.

Historically, printing plate precursors were imagewise exposed to imaging radiation through an image-bearing photographic or color-separation transparency. Developments in the field of lithographic printing have provided radiation-sensitive compositions useful for the preparation of direct laser-addressable printing plate precursors. Digital imaging information can be used to image the printing form precursor without the need to utilize an imaging master such as a photographic transparency. Direct methods are commonly referred to as "computer-to-plate" (CTP) methods. In CTP methods, imaging information is generally stored digitally, such as in a computer file.

An example of a positive working, direct laser-addressable printing plate precursor is reported in U.S. Pat. No. 4,708,925 to Newman. This patent reports a lithographic printing plate precursor in which an imaging layer comprises a phenolic resin and a radiation-sensitive onium salt. The interaction of the phenolic resin and the onium salt produces an alkali-insoluble composition which is restored to alkali solubility upon photolytic decomposition of the onium salt. The printing plate precursor can be utilized in a positive-working mode, or a negative-working mode using additional process steps between exposure and development. The reported printing plate precursors are intrinsically sensitive to ultraviolet radiation and can be additionally sensitized to visible and infrared radiation.

U.S. Pat. Nos. 5,340,699 and 5,372,907 to Haley, et al. report a radiation-sensitive composition capable of functioning in either a positive-working or negative-working manner, comprising a resole resin, a novolak resin, a latent Bronsted acid, and an infrared absorber. The latent Bronsted acid is reported to increase the solubility of the resin on imagewise exposure. The printing plate precursors are intrinsically sensitive to ultraviolet radiation due to the acid-generating materials used, and can be laser-imageable.

U.S. Pat. No. 5,663,037 to Haley, et al. reports a radiation-sensitive composition capable of functioning in either a positive-working or negative-working manner and sensitive to both infrared and ultraviolet radiation, comprising a resole resin, a novolak resin, a haloalkyl-substituted s-triazine, and an infrared absorber.

U.S. Pat. No. 6,063,544 to Sheriff, et al. reports a positive-working lithographic printing plate including an imaging layer that consists essentially of a phenolic resin and an infrared-absorbing compound. The lithographic printing plate can reportedly be processed without post-exposure baking and without a floodwise exposure step.

U.S. Published application 2002/0048718 (application Ser. No. 09/431,706) of Zheng, et al. reports a positive-working imaging member comprising a heat-sensitive polymer containing a heat-activatable sulfonate group and a photothermal conversion material.

There is a desire in the printing industry for printing plate precursors that do not require chemical processing after imaging. One approach that yields a precursor that can be imaged without chemical processing is to make a precursor that is imaged and developed by a single ablation process. However, such precursors generally require a multi-layered coating, and require post-imaging handling that cannot generally be done on-press.

It is especially desirable in the industry to provide a precursor that is water-developable after imaging. Such a printing plate precursor could be developed after imaging without the need for special developer solution or for specialized developing equipment. A precursor developable in plain water is reported, for example, in European Patents 0 770 497 and 0 773 112 to Vermeersch, et al. and U.S. Pat. No. 6,017,677 to Maemoto, et al.

Furthermore, there is a desire for on-press-developable printing plate precursors that can be directly mounted onto a printing press without development steps. There is also a desire for thermally sensitive compositions that can be coated onto a substrate using water as a solvent.

Presently known thermally sensitive or photosensitive compositions comprising phenolic resins do not provide these features. For example, known printing plate precursors comprising phenolic resins generally require the use of an alkaline developer containing inorganic or organic metasilicates. Handling and preparation of a developer solution, is time-consuming, costly, consumes chemical resources, and generates large amounts of chemical waste.

SUMMARY OF THE INVENTION

The present invention provides a thermally sensitive composition that may be coated as a water-borne material onto a substrate to yield a printing plate precursor. Furthermore, the invention also provides a printing plate precursor that may be imaged and then developed in water that is free from organic solvents or inorganic additives (i.e., "plain water"). Such printing plates are on-press-developable when used with a fountain solution.

In one embodiment, the present invention provides a sulfated phenolic resin. The sulfated phenolic resin may be water-soluble. The invention further provides compositions comprising sulfated phenolic resins. The compositions may include a radiation-absorbing component, and may be thermally sensitive. The compositions may include a polymeric binder.

In another embodiment, the invention provides a printing plate precursor comprising a substrate and an imageable coating, the imageable coating comprising a sulfated phenolic resin. The printing plate precursor is useful for making a plate having ink-receptive image areas. In some embodiments, the printing plate precursor can be developed after imagewise exposure by washing with water to remove unexposed areas.

The invention also provides a method for making printing a plate precursor having an imageable coating on a substrate, the imageable coating comprising a sulfated phenolic resin. The method includes the steps of: a) applying to the substrate a composition comprising a solvent and a sulfated phenolic resin dispersed in the solvent; and b) removing at least some of the solvent to leave an imageable coating on the substrate. In some embodiments, the solvent comprises water and is pH-adjusted to be neutral or basic. In other embodiments, the solvent is water that is free from organic solvents.

Also provided by the invention is a method for making an imaged printing plate from the printing plate precursor. The method further includes the steps of: c) imagewise exposing the coating to imaging radiation to produce exposed areas and unexposed areas of the coating; and d) contacting the coating with a liquid developer to remove unexposed areas of the coating, while leaving exposed areas as ink-receptive image areas. In some embodiments, the liquid developer is water. In other embodiments, the liquid developer is a fountain solution/ink dispersion, and the step of contacting the coating with a liquid developer is done on-press.

DETAILED DESCRIPTION OF THE INVENTION

This invention provides a water-soluble sulfated phenolic resin, and a patterning composition for a printing plate precursor that does not require chemical processing to be developed. More specifically, the invention provides a water-developable or on-press-developable printing plate precursor. The invention provides printing plate precursors which, after imagewise exposure, can be either developed by water, or subjected to a printing operation without requiring the development of the images with a conventional developing solution.

Sulfated Phenolic Resin, and Thermally Sensitive Composition

In one embodiment, the present invention provides a sulfated phenolic resin. In some embodiments, the sulfated phenolic resin is water-soluble. The sulfated phenolic resin may be useful, for example, in making a thermally sensitive composition. The thermally sensitive composition may include a radiation-absorbing component. The composition may also include a polymeric binder.

As used herein, the phrase "phenolic resin" means a polymeric material having a structure including hydroxy-substituted aromatic rings as part of the polymer backbone. Phenolic resins are generally made by a condensation reaction between a substituted or unsubstituted phenol and an aldehyde.

Most commonly, phenolic resins are made from a catalyzed condensation reaction between phenol and formaldehyde. Phenolic resins are therefore also known as "phenol-formaldehyde resins." However, phenolic resins may be made using a wide variety of phenolic reactants and aldehyde reactants or ketone reactants.

The term "phenolic reactant" is used herein to refer to a substituted or unsubstituted phenol. Phenolic reactants include, for example, phenol; benzene diols and polyols such as catechol, hydroquinone, resorcinol, 2-methylresorcinol, 4-methylresorcinol 5-methylresorcinol, pyrogallol and 5-methylpyrogallol; cresols including o-cresol, m-cresol, and p-cresol; xylenols such as 2,5-xylenol, 3,5-xylenol, 3,4-xylenol and 2,3-xylenol; alkyl-substituted phenols such as o-ethylphenol, m-ethylphenol, p-ethylphenol, o-t-butylphenol, m-t-butylphenol p-t-butylphenol, p-octylphenol; and polyalkyl-substituted phenols such as 2,3,4-trimethylphenol, 2,3,5-trimethylphenol, 2,4,5-trimethylphenol, 3,4,5-trimethylphenol, 2,3-diethylphenol, 3,5-diethylphenol, 2,3,5-triethylphenol and 3,4,5-triethylphenol; alkoxy-substituted phenols such as o-methoxyphenol, m-methoxyphenol, p-methoxyphenol, 2,3-dimethoxyphenol, 2,5-dimethoxyphenol and 3,5-dimethoxyphenol, 2-methoxy-4-methylphenol, o-ethoxyphenol, m-ethoxyphenol, p-ethoxyphenol, o-propoxyphenol, m-propoxyphenol, p-propoxyphenol, m-butoxyphenol and p-butoxyphenol; bisalkylphenols such as 2-methyl-4-isopropylphenol; halo-substituted phenols such as m-chlorophenol, p-chlorophenol, o-chlorophenol, and dichlorophenol; bisphenols such as bisphenol A, B, C, E or F; dihydroxybiphenyl phenylphenol, and naphthols such as α-naphthol, β-naphthol, though the invention is not restricted thereto. The phenolic reactants may be used independently or as a mixture of two or more thereof.

The term "aldehyde reactant" is used herein to refer to an aldehyde that is suitable for use as a reactant in a condensation reaction with a phenolic reactant. As the aldehyde reactant, use can be made of, for example, formaldehyde, paraformaldehyde, acetaldehyde, propionaldehyde, benzaldehyde, phenyacetaldehyde, α-phenypropylaldehyde, β-phenypropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzladehyde, m-methylbenzaldehyde, p-methylbenzaldehyde, p-ethylbenzaldehyde, p-n-butylbenzaldehyde, furfural, chloroacetaldehyde, and acetal derivatives thereof such as chloroacetaldehyde diethyl acetal, though the invention is not restricted thereto. The aldehyde reactants may be functionalized to include substituents or functional groups other than alkyl groups. The aldehyde reactants may be used independently or as a mixture of two or more thereof.

The term "ketone reactant" is used herein to refer to a ketone that is suitable for use as a reactant in a condensation reaction with a phenolic reactant. Examples of suitable ketones include acetone (propanone), butanone (methylethyl ketone), 2-pentanone, 3-pentanone, etc., though the invention is not restricted thereto. The ketone reactants may be functionalized to include substituents or functional groups other than alkyl groups. The ketone reactants may be used independently or as a mixture of two or more thereof.

Depending on the preparation route for the condensation reaction, a range of phenolic resins with varying structures and properties can be formed. The type of catalyst and the molar ratio of the reactants used in the preparation of phenolic resins determines their molecular structure, and therefore the physical properties of the resin. Conventional methods known for the preparation of phenolic resins may be used for the practice of the present invention. Particularly useful in this invention are novolak resins, resole resins and novolak/resole resin mixtures. Novolak resins, resole resins, and novolak/resole resin mixtures are commercially available.

Resole resins are obtained by the alkaline-catalyzed reaction between a phenolic reactant and an aldehyde reactant. A molar ratio of less than one mole phenol reactant per mole of aldehyde reactant must be used in the preparation of a resole resin. A molar ratio of less than 1:1 to about 1:3 is generally used to prepare resole resins. Resole resins consequently contain reactive methylol ($—CH_2OH$) groups. The reactive methylol groups can react upon heating to effect crosslinking of the resole resin, thus providing characteristics of a thermoset material to resole resins.

Novolak resins are obtained by the acid-catalyzed reaction between a phenolic reactant and an aldehyde or ketone reactant. A molar ratio of greater than one mole phenolic reactant per mole of aldehyde or ketone reactant must be used in the preparation of a novolak resin. A molar ratio between about 2:1 and 1:1, preferably between about 2:1 to about 5:4 is generally used to prepare novolak resins. Novolak resins do not contain reactive methylol groups. Novolak resins are thermoplastic in nature, and generally do not crosslink upon heating unless a curing agent is incorporated into the resin material. Novolak resins are well-known and are described, for example, in U.S. Pat. No. 4,308,368 to Kubo, et al., U.S. Pat. No. 4,845,008 to Nishioka, et al., U.S. Pat. No. 5,437,952 to Hirai, et al., U.S. Pat. No. 5,491,046 to DeBoer, et al., U.S. Pat. No. 5,143,816 to Mizutani, et al., and Great Britain Patent 1,546,633 to Engebrecht, et al.

As used herein, the phrase "sulfated phenolic resin" means a phenolic resin modified to have sulfate ($—OSO_3^-$) moieties attached to aromatic rings of the polymer backbone, in place of hydroxy substituents, for at least some of the repeating units of the polymer. The sulfate moieties may be in acid form ($—OSO_3H$), or in salt form with a corresponding counterion $X^{\oplus}$ ($—OSO_3^-X^{\oplus}$). The units comprising sulfate moieties will generally be randomly interspersed among the repeating units of the resin. However, the units comprising sulfate moieties may also be distributed in a more orderly fashion, such as in a segmented polymer or a block copolymer.

The sulfated phenolic resin of the present invention may be prepared, for example, by the reaction of a phenolic resin with a sulfation reagent in an organic solvent to replace hydroxy substituents with sulfate moieties. Suitable sulfation reagents may include sulfur trioxide ($SO_3$), chlorosulfonic acid ($ClSO_3H$), sulfamic acid ($H_2NSO_3H$), $SO_3$-pyridine complex, $SO_3$-trimethylamine complex, $SO_3$-triethylamine complex, $SO_3$-trialkylamine complexes, $SO_3$-triarylamine complexes, and $SO_3$-N,N-dimethylformamide complex, for example.

Methods for sulfating organic compounds are described, for example, in U.S. Pat. No. 6,448,435 to Jacobson, et al., and in *Sulfonation and Sulfation Processes* by Norman C. Foster (The Chemithon Corporation, 1997). Methods for sulfating hydroxyl-containing polymers are described in U.S. Pat. No. 4,177,345 to Schweiger, U.S. Pat. No. 4,318,815 to Tyler, and U.S. Pat. No. 5,750,656 to Myers. Such methods are suitable for the sulfation of phenolic resins. Methods for sulfating commercially available phenolic resins are also described in the following Examples.

In the reaction of a sulfation reagent with a phenolic resin to yield a sulfated phenolic resin, the reaction may be controlled so that fewer than all the hydroxy substituents of the phenolic resin are replaced by sulfate moieties. One particularly useful way of controlling the number of hydroxy substituents that are replaced is by arranging the reaction so that the sulfation reagent is a limiting reagent.

Other conventional methods may be suitable for preparing a sulfated phenolic resin. By way of example, a sulfated phenolic resin could be made by copolymerization of appropriate starting materials, or by sulfation of a phenolic resin that comprises protecting groups at some sites normally occupied by hydroxy groups.

For the sulfated phenolic resins of the present invention, a "degree of sulfation" can be defined as a measure of the number of repeating units that comprise sulfate moieties. As used herein, the phrase "degree of sulfation" is the ratio of the number of polymer units that comprise sulfate moieties in a sulfated phenolic resin, divided by the total number of phenolic-type units in the resin. By way of example, a degree of sulfation of 0.25 indicates that 25% of the phenolic-type units of the resin are sulfated.

In some embodiments, the sulfated phenolic resin is characterized by an average molecular weight of about 1 kDa to about 500 kDa.

One sulfated phenolic resin of the present invention comprises a polymer including repeating units represented by the following structures A and B:

A

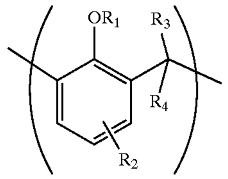

B

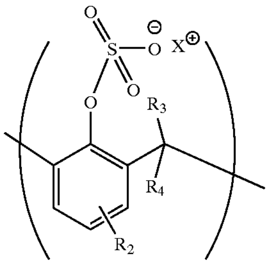

where $R_1$, $R_2$, $R_3$, and $R_4$ are independently hydrogen, alkyl, alkenyl, alkynyl, aryl, alkaryl, or aralkyl; $X^{\oplus}$ represents a positively charged counterion. For this sulfated phenolic resin, the degree of sulfation will be represented by "m," and defined as the ratio of the number of B units (i.e., sulfated phenolic units) to the sum of the number of A units plus the number of B units (i.e., total number of phenolic-type units). In one particular embodiment, $R_1$, $R_3$, and $R_4$ are hydrogen and $R_2$ is methyl. In another embodiment, m is in the range from about 0.25 (i.e., 1 B unit to 3 A units) to about 1.0 (i.e., all B units). In other embodiments, m is greater than about 0.5.

The term "alkyl" as used herein means linear or branched saturated hydrocarbon substituents having one to about twenty carbon atoms or, preferably, one to about twelve carbon atoms. Examples of such substituents include methyl, ethyl, n-propyl, isopropyl, n-butyl, isobutyl, sec-butyl, tert-butyl, pentyl, iso-amyl, and hexyl. Alkyl substituents within this definition may also be substituted at a substitutable position with one or more substituents, such as alkoxy, hydroxyl, amino, halo, nitro, acyl, cyano, carboxy, or thioalkyl, for example. The term "alkyl" takes the same meaning when used in naming other substituents herein, such as "haloalkyl" and "hydroxyalkyl."

The terms "alkenyl" and "alkynyl" are used to indicate linear or branched unsaturated hydrocarbon substituents having one to about twenty carbon atoms or, preferably, one to about twelve carbon atoms. Alkenyl substituents comprise a double bond in the carbon chain, while alkynyl substituents comprise a triple bond. Alkenyl and alkynyl substituents within this definition may also be substituted at a substitutable position with one or more substituents, such as alkoxy, hydroxyl, amino, halo, nitro, acyl, cyano, carboxy, or thioalkyl, for example.

The term "aryl" as used herein means a carbocyclic aromatic system containing one, two or three rings wherein such rings may be attached together in a pendent manner or may be fused. The term "aryl" embraces aromatic substituents such as phenyl, naphthyl, tetrahydronaphthyl, indane and biphenyl. Aryl substituents within this definition may also be substituted at a substitutable position with one or more substituents, such as alkyl, haloalkyl, alkoxy, hydroxyl, amino, halo, nitro, alkylamino, acyl, cyano, carboxy, thioalkyl, alkoxycarbonyl, for example. An aryl substituent comprising an alkyl substituent at a substitutable position is referred to herein as "alkaryl."

The term "aralkyl" embraces aryl-substituted alkyl substituents such as benzyl, diphenylmethyl, triphenylmethyl, phenylethyl, and diphenylethyl. The aryl in said aralkyl may be additionally substituted with halo, alkyl, alkoxy, halkoalkyl and haloalkoxy. The terms benzyl and phenylmethyl are understood to be interchangeable.

Another sulfated phenolic resin of the invention comprises a polymer including repeating units represented by the structures A and B, with $R_1$, $R_2$, $R_3$, and $R_4$ and m as defined above, and with $X^{\oplus}$ representing a positive ion selected from the group consisting of lithium ion, potassium ion, and sodium ion.

Yet another sulfated phenolic resin of the invention comprises a polymer including repeating units represented by the structures A and B, with $R_1$, $R_2$, $R_3$, and $R_4$ and m as defined above, and with $X^{\oplus}$ representing a positive ion selected from the group consisting of ammonium, alkylammonium, aryl ammonium, cyclic ammonium, pyrrolidinium, pyridinium, diazonium, sulfonium, and iodonium. The diazoniums, sulfoniums, and iodoniums reported in U.S. Pat. No. 4,708,925 to Newman and U.S. Published application 2002/0068241 (application Ser. No. 09/964,611) of Oohashi, et al. may suitably be employed, for example. In particular, the counterion $X^{\oplus}$ may be ammonium.

In some embodiments, a sulfated phenolic resin of the present invention is water-soluble to a significant degree. For example, one gram of a water-soluble sulfated phenolic resin may be dissolved in about 100 mL of water or less at room temperature. More preferably, at least about 3 to about 15 grams or more of a water-soluble sulfated phenolic resin may readily be dissolved in 100 mL water at room temperature. For some water-soluble sulfated phenolic resins of the invention, the degree of sulfation may be about 0.25 or greater, preferably about 0.3 or greater, and most preferably about 0.5 or greater.

An aqueous solution of a sulfated phenolic resin should be maintained at a neutral to basic pH. If the pH of an aqueous solution of a sulfated phenolic resin is less than 5, especially less than 4, the sulfated phenolic resin is not stable in solution and may decompose or form a precipitate. For a discussion on the pH-dependence of the solubility of phenolic resins, see Flanagin, et al., *Macromolecules* 32, 5337 (1999). The pH of the solution may be adjusted by conventional means, including adding a suitable quantity of acid, base, or buffer.

The invention includes compositions that comprise a sulfated phenolic resin. The compositions may consist essentially of the sulfated phenolic resin, or may include other components.

For example, the sulfated phenolic resin may be included in a thermally sensitive composition. Thermally sensitive compositions comprising the sulfated phenolic resins may undergo a physical or chemical change upon exposure to radiation. Such a thermally sensitive composition may be useful in making radiation-sensitive lithographic printing plate precursors, photoresist, microelectronic and microoptical devices, printed circuit boards, paint compositions, molding compositions and in photomask lithography or imprint lithography.

In some embodiments of a thermally sensitive composition, the sulfated phenolic resin accounts for at least about 50% by weight of the thermally sensitive composition. In other embodiments, the sulfated phenolic resin may account for at least 70%, at least 80%, at least 90%, or at least 95% of the thermally sensitive composition, by weight.

A thermally sensitive composition comprising the sulfated phenolic resin may include components such as a binder or a radiation-absorbing component.

Many binders are known in the art of thermally sensitive or photosensitive compositions. Polymeric binders are preferred. A water-soluble binder, for example, may suitably be employed in a thermally sensitive composition of the present invention. Suitable water-soluble binders include, for example, polyvinyl pyrrolidone, polyvinyl alcohol, polyacrylamide, polyacrylic acid, polyvinylimidazole, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose, and carboxymethylcellulose.

Binders that are not water-soluble are also suitable. Some suitable water-insoluble binders include polyvinyl pyrrolidone/vinyl acetate copolymers and polyvinyl pyrrolidone/vinyl caprolactam copolymers, for example.

Where the thermally sensitive composition comprises a binder, the binder accounts for not more than about 30% by weight of the thermally sensitive composition, preferably not more than about 20%, more preferably not more than about 10%, and most preferably not more than about 5%, by weight.

A radiation-absorbing component may include a dye or pigment, for example. The radiation-absorbing component should be selected to absorb radiation in the frequency range that is to be used for photoinitiation. Many suitable dyes and pigments are known in the art of thermally sensitive and photosensitive compositions. Examples of suitable pigments include carbon black, HELIOGEN GREEN, NIGROSINE BASE, iron (III) oxide, manganese oxide, PRUSSIAN BLUE, and PARIS BLUE.

Examples of suitable classes of dyes include polymethine dyes, cyanine dyes, hemicyanine dyes, streptocyanine dyes, squarylium dyes, and oxonol dyes. In one embodiment, the radiation absorber includes an infrared-absorbing dye ("IR dye"). Suitable IR dyes may be chosen from many classes of dyes including azo dyes, squarylium dyes, croconate dyes, triarylamine dyes, thiazolium dyes, indolium dyes, oxonol dyes, oxazolium dyes, cyanine dyes, merocyanine dyes, indocyanine dyes, indotricarbocyanine dyes, oxatricarbocyanine dyes, phthalocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bis(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, a substituted form of any of the preceding, or an ionic form of any of the preceding. Suitable dyes are also disclosed in U.S. Pat. No. 5,208,135 to Patel et al., which is incorporated herein by reference.

The thermally sensitive composition may include from about 0.1% to about 25% by weight of a radiation-absorbing component. When the radiation-absorbing component is a pigment, suitably about 5% to about 25% by weight, and preferably about 10% to about 20% by weight, of the thermally sensitive composition is the pigment. When the radiation-absorbing component is a dye, suitably about 0.1% to about 20% by weight, and preferably about 2% to about 15% by weight, of the thermally sensitive composition is the dye.

Printing Plate Precursor

The invention further provides a printing plate precursor comprising a substrate and an imageable coating on the substrate, the imageable coating comprising a sulfated phenolic resin.

For the manufacture of printing plate precursors, conventional substrates may be used. Conventional substrates are generally a sheet or plate material. For example, the use of an aluminum plate as the substrate is suitable. Additionally, other substrate materials may be suitable, such as: steel, zinc, or copper foil; polymeric sheets such as those made from polyethyleneterephthalate or cellulose acetate; or screen printing substrates such as Perlon gauze.

In some embodiments, the substrate has a hydrophilic surface that will be exposed upon imaging of the imageable coating. A hydrophilic substrate is used when a wet printing plate is desired (i.e., when a fountain solution will be used in the press). A preferred substrate for a wet printing plate is an electrochemically grained and anodized aluminum support. In other embodiments, the substrate may include an oleophobic surface so that a waterless printing plate will be produced when the precursor is imaged.

Substrate pretreatments may be necessary, as determined by the choice of substrate and the particular application; conventional pretreatments will be suitable. In some instances, the preparation of the substrate to receive a coating will be minimal, and in other cases it may be extensive.

When an aluminum substrate is used, it is desirable to pretreat the surface to be coated by a mechanical or chemical process. The pretreatment may include roughening the surface by brushing in a dry state, brushing with an abrasive suspension, or electrochemically, e.g. in an hydrochloric acid electrolyte, to roughen the surface in order to improve the adhesiveness of the coating to the surface or to improve the water wettability of the surface. The pretreatment may also include anodic oxidation of the roughened plate in sulfuric or phosphoric acid. The oxidized plate may then subjected to a hydrophilizing treatment, such as in an aqueous solution of poly(vinylphosphonic acid) or phosphonic acid.

The above-described substrate pretreatment is conventional in the art. A detailed description of a suitable pretreatment may be found in European Patent Application EP 1 106 381. Other substrate pretreatments may also be suitable.

The printing plate precursor comprises an imageable coating on the substrate, the imageable coating comprising a sulfated phenolic resin. The sulfated phenolic resin may be any of those described above. Sulfated phenolic resins in salt form (i.e., comprising predominantly —$OSO_3^-$ moieties) may be more suitable than sulfated phenolic resins in acid form (i.e., comprising predominantly —$OSO_3H$ moieties), for some applications. In some embodiments, the sulfated phenolic resin is characterized by an average molecular weight in the range from about 1 kDa to about 500 kDa. In other embodiments, the sulfated phenolic resin is characterized by an average molecular weight in the range from about 5 kDa to about 100 kDa.

In some embodiments, at least about 50% by weight of the imageable coating is the sulfated phenolic resin. In other embodiments, the sulfated phenolic resin may account for at least 70%, at least 80%, at least 90%, or at least 95% of the imageable coating, by weight.

The imageable coating of the printing plate precursor may be water-soluble prior to imaging, in some embodiments. A water-soluble imageable coating may be made using a water-soluble sulfated phenolic resin. In some embodiments, the water-soluble sulfated phenolic resin is a sulfated phenolic resin having a degree of sulfation of about 0.25 or greater, preferably about 0.3 or greater, and most preferably about 0.5 or greater. Sulfated phenolic resins in salt form (i.e., comprising predominantly —$OSO_3^-$ moieties) may be more suitable than sulfated phenolic resins in acid form (i.e., comprising predominantly —$OSO_3H$ moieties), for making a water-soluble imageable coating.

In some embodiments, a coating weight for the imageable coating on the substrate is suitably about 0.5 $g/m^2$ to about 2.5 $g/m^2$, and preferably the coating weight is about 1 $g/m^2$ to about 1.5 $g/m^2$.

The imageable coating may include components such as a binder or a radiation-absorbing component, or other fillers or additives known in the art. By way of example, the imageable coating may also include additives such as dispersing agents, humectants, biocides, plasticizers, surfactants, viscosity modifiers or rheology modifiers, colorants, pH adjusters, drying agents, defoamers, preservatives, antioxidants, development aids, or combinations thereof.

Many binders are known in the art of imageable coatings. Polymeric binders are preferred. In some embodiments, the binder accounts for not more than about 30% by weight of imageable coating, preferably not more than about 20%, more preferably not more than about 10%, and most preferably not more than about 5%.

A water-soluble binder may suitably be employed in the imageable coating. Suitable water-soluble binders include those listed above. Binders that are not water-soluble are also suitable.

In some embodiments, the binder includes polyvinyl pyrrolidone. The polyvinyl pyrrolidone may be water-soluble. In other embodiments, the polyvinyl pyrrolidone has a molecular weight in the range of about 40 kDa to about 1500 kDa.

A radiation-absorbing component may include a dye or pigment, for example. The radiation-absorbing component should be selected to absorb radiation in the frequency range that is to be used for imaging the coating. When a pigment is used, the pigment is suitably a material that can absorb infrared radiation and convert it to heat. Examples of suitable pigments include carbon black, HELIOGEN GREEN, NIGROSINE BASE, iron (III) oxide, manganese oxide, PRUSSIAN BLUE, and PARIS BLUE. Examples of suitable classes of dyes include polymethine dyes, cyanine dyes, hemicyanine dyes, streptocyanine dyes, squarylium dyes, and oxonol dyes.

For the purposes of lithographic printing, imaging is commonly done using an infrared laser. Therefore, an infrared-absorbing dye may be suitably employed as the radiation-absorbing component. In one embodiment, the imageable coating includes an infrared-absorbing dye ("IR dye"). Suitable IR dyes may be chosen from many classes of dyes including azo dyes, squarylium dyes, croconate dyes, triarylamine dyes, thiazolium dyes, indolium dyes, oxonol dyes, oxazolium dyes, cyanine dyes, merocyanine dyes, indocyanine dyes, indotricarbocyanine dyes, oxatricarbocyanine dyes, phthalocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bis(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, a substituted form of any of the preceding, or an ionic form of any of the preceding. Suitable dyes are also disclosed in U.S. Pat. No. 5,208,135 to Patel et al., which is incorporated herein by reference.

The imageable coating may include from about 0.1% to about 25% by weight of a radiation-absorbing component. When the radiation-absorbing component is a pigment, suitably about 5% to about 25% by weight, and preferably about 10% to about 20% by weight, of the imageable coating is the pigment. When the radiation-absorbing component is a dye, suitably about 0.1% to about 20% by weight, and preferably about 2% to about 15% by weight, of the imageable coating is the dye. As is demonstrated in the following Examples, a higher concentration of radiation-absorbing component can provide better sensitivity (or "plate speed"); however, if too much is included in the imageable coating, incomplete exposure throughout the coating may result.

Method for Making a Printing Plate Precursor

Also provided by the invention is a method for making a printing plate precursor having an imageable coating on a substrate, the method comprising the steps of: a) providing a substrate; b) applying to the substrate a composition comprising a solvent and a sulfated phenolic resin dispersed in the solvent; and c) removing at least some of the solvent to leave an imageable coating on the substrate; to obtain the printing plate precursor.

Suitable substrates for the method are described above. A preferred substrate for a wet printing plate is an electrochemically grained and anodized aluminum support. In other embodiments, the substrate includes an oleophobic surface so that a waterless printing plate will be produced when the precursor is imaged.

A composition comprising a sulfated phenolic resin dispersed in a solvent is applied to the substrate to make an imageable coating. Suitable sulfated phenolic resins are described above. The composition may further comprise components such as a binder or a radiation-absorbing component, or other fillers or additives known in the art. Suitable binders and radiation-absorbing components are described above. In some embodiments, at least about 50% by weight of the composition (not including solvent) is the sulfated phenolic resin. In other embodiments, the sulfated phenolic resin may account for at least 70%, at least 80%, at least 90%, or at least 95% of the composition (not including solvent), by weight.

The sulfated phenolic resin is carried by an appropriate solvent, such as an unreactive organic solvent or solvent mixture. The sulfated phenolic resin, along with other components, is dispersed, dissolved or suspended in the solvent. The dispersion, suspension or solution may suitably comprise about 3 to about 15 wt.-% of the sulfated phenolic resin. The concentration of sulfated phenolic resin should be appropriately chosen to provide the desired coating weight for the imageable coating.

Suitable organic solvents may include, for example: ketones such as methyl ethyl ketone; aromatic solvents such as toluene; alcohols; ethers; aliphatic solvents. A solvent should be chosen that is sufficiently volatile to be evaporated or removed to leave an imageable coating, and that can dissolve a sufficient quantity of the sulfated phenolic resin to leave a desired coating weight on the substrate.

An especially suitable solvent for the practice of the present invention, however, is water. Water may be employed as the solvent when the sulfated phenolic resin and other components are water-soluble. A water-soluble sulfated phenolic resin having a degree of sulfation of about 0.25 or greater, preferably about 0.3 or greater, and most preferably about 0.5 or greater is suitable. When a binder is included, a water-soluble binder should be chosen. An especially suitable water-soluble binder is polyvinyl pyrrolidone having a molecular weight in the range of about 40 kDa to about 1500 kDa.

By way of example, tap water, deionized water, or distilled water may be a suitable solvent. In one embodiment, the solvent is water that is free from organic solvents. When water is used as the solvent, the solvent-based composition should be maintained in a neutral or basic condition. If the pH of the composition is less than 5, or especially less than 4, the sulfated phenolic resin is not stable in solution and may decompose or form a precipitate. If the pH of the composition is greater than 8, or especially greater than 9, the resulting printing plate precursor may not be useable. For a discussion on the pH-dependence of the solubility of phenolic resins, see Flanagin, et al., *Macromolecules* 32, 5337 (1999). The pH of the composition may be adjusted by conventional means, including adding a suitable quantity of acid, base, or buffer.

The solvent-based composition may be applied to the substrate by any suitable method. For example, the solvent-based composition may be applied by way of any conventional coating process, such as by casting methods, spin-coating methods, wire-wound rod, bar coating, hopper/slot coating, curtain coating, air doctor coating, blade coating, air knife coating, squeeze coating, roll coating, reverse roll coating, transfer roll coating, gravure coating, kiss coating, cast coating, spray coating, dip coating, extrusion coating, or die coating, or other conventional methods.

In some embodiments, the composition is applied to the substrate to yield a dry coating weight suitably from about 0.5 $g/m^2$ to about 2.5 $g/m^2$ and preferably from about 1 $g/m^2$ to about 1.5 $g/m^2$.

After application of the solvent-based composition to the substrate, at least some of the solvent is removed to leave an imageable coating on the substrate, to yield the precursor. Removal of solvent can be accomplished by any ordinary means, such as by heating, application of vacuum, blow-drying, etc. By way of example only, solvent may be removed by sending the wetted substrate through a conveyor oven for a brief period to heat the solvent to near or above its boiling temperature, or by exposing the wetted substrate to an infrared heater, or by blowing hot air across the surface of the wetted substrate.

Method for Making an Imaged Printing Plate

The invention further provides a method for making an imaged printing plate having ink-receptive image areas, the method comprising: a) providing a substrate; b) applying to the substrate a composition comprising a solvent and a sulfated phenolic resin dispersed in the solvent; c) removing at least some of the solvent to leave an imageable coating on the substrate; d) imagewise exposing the coating to imaging radiation to produce exposed areas and unexposed areas of the coating; and e) contacting the coating with a liquid developer to remove unexposed areas of the coating, while leaving exposed areas as ink-receptive image areas; to yield the imaged printing plate.

Steps a) through c) may be performed as described above, using the substrates, sulfated phenolic resins, and solvent-based compositions described above, to yield a printing plate precursor having an imageable coating.

The printing plate precursor is next imagewise exposed. Imagewise exposure may be done at any time; however, it has been observed that aging the imageable coating for about two days or longer prior to imaging may be advantageous. Such aging may generally be done at room temperature, or may be done at an elevated temperature.

Imagewise exposure may be accomplished by many methods. Conventional methods include imagewise application of heat, or imagewise application of electromagnetic radiation. Heat may be imagewise applied using a heated body such as a hot stylus, a soldering iron, or a thermal printing head. A suitable imaging apparatus may include at least one thermal head but would usually include a thermal head array. Examples include thermal heads used in thermal fax machines and sublimation printers, such as TDK Model No. LV5416 (TDK Electronics Europe GmbH, Dusseldorf, Germany), or in thermal plotters, such as GS618-400 (Oyo Instruments LP, Houston, Tex.). Where imagewise exposure is accomplished by exposure to heat, it is not required that the imageable coating contain a radiation-absorbing component.

Electromagnetic radiation may be imagewise applied by means of flood exposure through an image-bearing transparency, or by controlled application of a suitable laser. Imaging with the present invention is preferably done with radiation in the visible or infrared region of the electromagnetic spectrum (i.e., wavelength range of 200 to 1500 nm). Where a radiation-absorbing component is included in the imageable coating, the imaging radiation should include a wavelength that falls within an absorbance band of the radiation-absorbing component, or that can be converted to heat by the radiation-absorbing component. Optimally, the source of imaging radiation will emit radiation at a wavelength that is as near to the peak of an absorbance band or absorbance maximum as possible. In other words, it is desirable to match the output of the radiation source to the absorbance band of the radiation-absorbing component, if feasible.

The printing plate precursor may, for example, be imagewise exposed using semiconductor lasers or laser diodes which emit in the near-infrared region of the electromagnetic spectrum. Such a laser beam can be digitally controlled via a computer; i.e. the laser can be turned on or off so that an imagewise exposure of the precursor can be effected via stored digitized information in the computer. Therefore, the precursors of the present invention are suitable for computer-to-plate (CTP) imaging.

Presently, high-performance lasers or laser diodes used in commercially available image setters emit infrared radiation in the wavelength ranges of between 800 and 850 nm or between 1060 and 1120 nm. Other infrared-emitting light sources may also be suitable. Non-lasing sources are also suitable for the practice of the present invention, provided that the necessary power is supplied to the imageable coating by radiation of the appropriate wavelength.

An example of an apparatus comprising a suitable radiation source for imagewise exposure is the Creo TRENDSETTER 3230 (CreoScitex, Burnaby, British Columbia, Canada), which contains a laser diode that emits near-infrared radiation at a wavelength of about 830 nm. Other apparatus comprising suitable radiation sources include the CRESCENT 42T PLATESETTER (Gerber Scientific, South Windsor, Conn.), an internal drum platesetter that operates at a wavelength of 1064 nm; and the Screen PLATERITE 4300 series or 8600 series (Screen USA, Rolling Meadows, Ill.). Direct-imaging presses, which are able to image a plate while attached to a printing press cylinder, may also comprise suitable radiation sources. An example of a direct imaging printing press is the SPEEDMASTER 74-DI press (Heidelberg USA, Inc., Kennesaw, Ga.).

Upon radiation exposure of the imageable coating, a hydrophilic element comprising the sulfated phenolic resin directly or indirectly absorbs the radiation energy and is decomposed to generate a hydrophobic element. A possible mechanism for the transformation from hydrophilic to hydrophobic is suggested by Burstein, et al., *J. Am. Chem. Soc.* 80, 5235 (1958) or Kice, et al., *J. Am. Chem. Soc.* 88, 5242 (1966).

The transformation provides a solubility difference between exposed areas, which become hydrophobic and less soluble in water or a liquid developer, and unexposed areas, which remain hydrophilic and soluble in water or a liquid developer. As used herein, the phrases “more soluble” and “less soluble” are used to indicate a solubility differential that is useful and practical for the purposes of making a printable lithographic printing plate.

The method optionally includes a heating step at a temperature and time period sufficient to increase the robustness of exposed areas before developing. Such heat-treatment may also increase hydrophobicity of exposed areas. After the printing plate precursor has been imagewise exposed, it may be briefly heated to a temperature of 85° to 160° C. Depending on the temperature, the heating step may take from about one to about five minutes.

After imagewise exposure and any optional heat treatment of the precursor, the exposed printing plate precursor is then developed with a liquid developer to obtain a printable lithographic printing plate. The exposed imageable coating is contacted with the liquid developer, and unexposed areas of the imageable coating are removed by the developer, leaving exposed areas as ink-receptive image areas. It has been observed that aging the exposed precursor for about two days or longer prior to developing may be advantageous. Such aging may generally be done at room temperature, or may be done at an elevated temperature.

Where the substrate comprises an oleophobic surface that is covered by the imageable coating prior to imagewise exposure, developing the exposed printing plate precursor will uncover the oleophobic surface in areas from which the unexposed areas of the coating are removed. The resulting printing plate can then be used as a waterless printing plate. Where the substrate comprises a hydrophilic surface that is covered by the imageable coating prior to imagewise exposure, developing the exposed printing plate precursor will uncover the hydrophilic surface in areas from which the unexposed areas of the coating are removed. The resulting printing plate can then be used as a wet printing plate.

As discussed above, if the imageable coating is applied as a water-based composition, the pH of the composition must be carefully controlled. If the pH is greater than 8, or especially greater than 9, the resulting printing plate precursor may not be useable, as the imageable coating may fail to yield ink-receptive image areas upon developing. After imagewise exposure of the imageable coating, a latent image may be seen in the imageable coating, but both exposed and unexposed regions of the composition could wash away in a liquid developer. In cases where this behavior was observed, no image was obtained regardless of exposure energy.

In some embodiments, the exposed printing plate precursor is developable in aqueous developers, including on-press developability with fountain solution and printing ink. The exposed printing plate precursor may be directly mounted on press, wherein the unexposed areas are removed by fountain solution and/or ink, thereby avoiding a separate development step. It is noted that plates designed for on-press development can alternatively be developed by a conventional process using a suitable aqueous developer, which are conventional in the art. The plates provided by this invention include on-press developable plates as well as plates which are intended for other development processes.

In other embodiments, the exposed printing plate precursor is developable in water. The liquid developer may then consist essentially of water, without organic solvents or inorganic additives. No inorganic or organic metasilicates are required in the liquid developer, and the liquid developer does not need to be alkaline. Tap water, deionized water, or distilled water may be suitable as the liquid developer, for example.

In the practice of this method, handling and preparation of a developer solution, which can be time-consuming and which consumes resources, is eliminated. The method may be practiced without specialized developing equipment, which is necessary for developing with spray-on or immersion developer solutions. Furthermore, the method does not require the generation of large quantities of chemical waste, unlike methods that require conventional developing solutions. The invention therefore provides a more ecologically friendly approach for the manufacture of printing plates.

The imaged and developed printing plate may treated with a preservative, a process known as "gumming." The preservative is generally aqueous solutions of hydrophilic polymers, wetting agents and other additives. The imaged printing plate can also be subjected to other post-development steps, such as heat-treating or baking to increase the press run length.

EXAMPLES

Example 1

Preparation of Sulfated Phenolic Resins

Example 1A

Preparation of a Sulfated N-13 Phenolic Resin with Ammonium Counterion

In a 250-mL flask equipped with magnetic stirring bar, 10.0 g of novolak N-13 (a m-cresol novolak resin having a MW of about 13 kDa, supplied by Eastman Kodak Co., Rochester, N.Y.), 8.0 g of pyridine-$SO_3$ complex (Sigma-Aldrich Inc., St. Louis, Mo.), and 50 g of pyridine were mixed, and the mixture was stirred at room temperature for 18 hours. Solvent was then decanted from the reaction.

The reaction product was stirred with 10 mL of 30% aqueous ammonium hydroxide for 30 minutes. The resulting sulfated phenolic resin was precipitated in 600 mL of isopropyl alcohol.

The precipitate was then dissolved in 100 g of water to yield a 17 wt.-% aqueous solution for further use. The sulfated phenolic resin in aqueous solution was maintained at a pH of about 7 or above. The sulfated resin is stable in neutral or basic conditions, but will decompose when exposed to acidic conditions.

Based on the quantity of reagents used, the theoretical degree of sulfation (i.e., assuming 100% substitution) was about 0.60. An elemental analysis was performed on the precipitate to determine the actual degree of sulfation. The sulfur content was approximately 7.8% by weight, which suggested a degree of sulfation of about 0.40. This result may indicate either that the reaction was slightly incomplete, or that the pyridine-$SO_3$ complex had partially decomposed prior to the sulfation reaction.

Example 1B

Preparation of a Sulfated N-13 Phenolic Resin with Pyridinium Counterion

In a 250-mL flask equipped with magnetic stirring bar, 10.0 g of novolak N-13, 8.0 g of pyridine-$SO_3$ complex, and 50 g of pyridine were mixed, and the mixture was stirred at room temperature for 18 hours. Solvent was then decanted from the reaction.

The resulting polymer was then washed with 50 mL of isopropyl alcohol three times, and was then dissolved in 85 g of water to form a 26.7 wt.-% aqueous solution for further use. The sulfated phenolic resin in aqueous solution was maintained at a pH of about 7 or above. The sulfated resins are stable in neutral or basic conditions, but will decompose when exposed to acidic conditions.

Example 1C

Preparation of a Sulfated LB6564 Phenolic Resin with Ammonium Counterion 50.0 g of pyridine-$SO_3$ complex was added into a solution containing 36.0 g of LB6564 phenolic resin (Sumitomo Bakelite Co. Ltd., Tokyo, Japan) and 120 g of N,N-dimethylformamide. The solution was stirred at room temperature for about 20 hours. 60 mL of 28% aqueous ammonium hydroxide solution was added and the mixture was stirred for another two hours. Then 135 mL of methanol was added, and the mixture stirred for an additional two hours.

The resulting cloudy suspension was filtered and the sulfated phenolic resin was precipitated by adding 1.5 L of acetone into the filtrate while stirring. After decanting acetone and then drying by nitrogen gas stream, the precipitate was dissolved in 100 mL of water to form a 24.3 wt-% aqueous solution for further use. The sulfated phenolic resin in aqueous solution was maintained at a pH of about 7 or above. The sulfated resin is stable in neutral or basic conditions, but will decompose when exposed to acidic conditions.

Example 1D

Preparation of a Sulfated N-15 Phenolic Resin with Ammonium Counterion 25.0 g of pyridine-$SO_3$ complex was added into a solution containing 18.0 g of N-15 phenolic resin (Eastman Kodak Co., Rochester, N.Y.) and 60 g of N,N-dimethylformamide. The solution was stirred at room temperature for about 20 hours. 30 mL of 28% aqueous ammonium hydroxide solution was then added and the mixture was stirred for another two hours. Then 70 mL of methanol was added, and the mixture was stirred for an additional two hours.

The resulting cloudy suspension was filtered and the sulfated phenolic resin was precipitated by adding 800 mL of acetone into the filtrate while stirring. After decanting acetone and drying by nitrogen gas stream, the precipitate was dissolved in 150 mL of water to form a 12.8 wt-% aqueous solution for further use. The sulfated phenolic resin in aqueous solution was maintained at a pH of about 7 or above. The sulfated resin is stable in neutral or basic conditions, but will decompose when exposed to acidic conditions.

Example 1E

Preparation of a Sulfated AP Phenolic Resin with Ammonium Counterion

In a 250-mL flask equipped with magnetic stirring bar, 5.0 g of AP resin (an acetone-pyrogallol phenolic resin obtained from Clariant S.A., Brignais, France), 4.0 g of pyridine-$SO_3$ complex, and 40 g of pyridine were mixed, and the mixture was stirred at room temperature for 18 hours. Solvent was then decanted from the reaction.

The reaction product was stirred with 5 mL of 30% aqueous ammonium hydroxide for 30 minutes. The resulting sulfated phenolic resin was precipitated in 350 mL of THF. The precipitate was then dissolved in 30 g of water to yield a 21 wt.-% aqueous solution for further use.

Example 2

Preparation of Printing Plat Precursors and Imaged Printing Plates

The following compositions are referred to throughout the Examples:

IR Dye A—Infrared-absorbing dye having the following structure:

IR Dye B—Infrared-absorbing dye having the following structure:

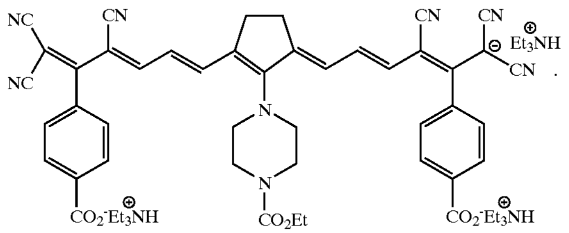

The IUPAC name for IR Dye B is 4-[5-(4,6,6-tricyano-5-(4-carboxyphenyl)-2,4-hexadienylidene)-2-(4,6,6-tricyano-5-(4-carboxyphenyl)-1,3,5-hexatrienyl)-1-cyclopenten-1-yl]-1-piperazinecarboxylic acid, ethyl ester, complexed with N,N-diethylethanamine (1:3).

IR Dye C—Infrared-absorbing dye having the following structure:

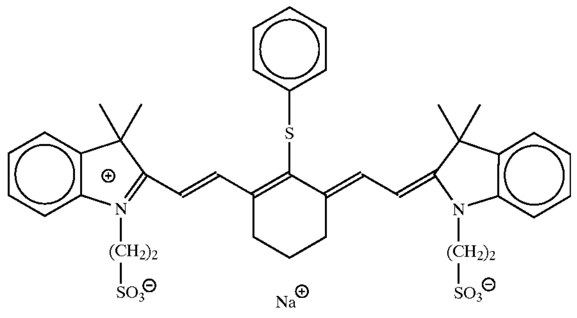

IR Dye D—Infrared-absorbing dye having the following structure:

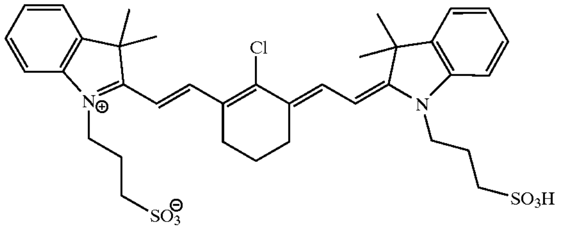

The IUPAC name for IR Dye D is 2-[2-[2-chloro-3-[[1,3-dihydro-1,1-dimethyl-3-(3-sulfopropyl)-2H-benz[e]indol-2-ylidene]ethylidene]-1-cyclohexen-1-yl]ethenyl]-1,1-dimethyl-3-(3-sulfopropyl)-1H-benz[e]indolium inner salt.

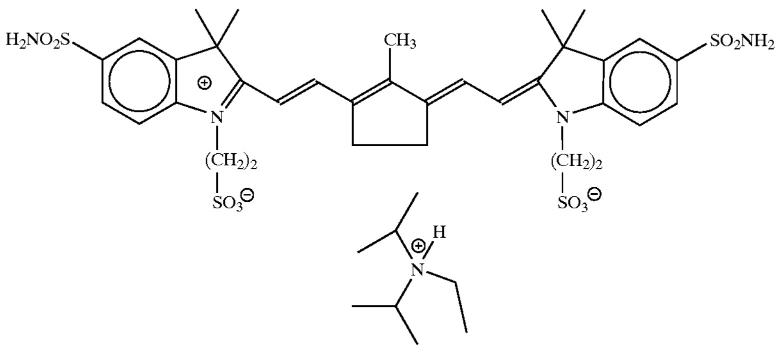

IR Dye E—Infrared-absorbing dye supplied by Siber Hegner North America (Baltimore, Md.), catalog number SH820WS.

LODYNE 103A—A fluorosurfactant as supplied by Ciba Specialty Chemicals (Tarrytown, N.Y.).

A.B. Dick Press—A.B. Dick duplicator press, as supplied by A.B. Dick Co. (Niles, Ill.). The press was charged with Van Son RUBBER BASE ink (Van Son Holland Ink Corp. of America, Mineola, N.Y.). The aqueous fountain solution contained LITHO ETCH 142W (Vam International, Addison, Ill.) at a concentration of 3 oz. per gallon and PAR (alcohol substitute supplied by Varn International) at a concentration of 3 oz. per gallon.

Example 2A

A coating solution was prepared by combining 9.8 g of a 17 wt.-% aqueous solution of sulfated N-13 phenolic resin (from Example 1A), 40 g of water, 0.4 g of IR Dye D, and 0.1 g of 10% LODYNE 103A.

An electrochemically grained and anodized aluminum substrate, post-treated with poly(vinylphosphonic acid) (PVPA), was mounted on a hot rotating drum. The substrate was then contacted with the coating solution, which was delivered to the substrate by a pumper, to yield a dry coating weight of about 0.86 $g/m^2$. The coated substrate was dried by blowing hot air at 150° F. for about 2 minutes over the substrate, to yield a printing plate precursor.

The resulting precursor was placed on a Creo TRENDSETTER 3244x image setter (CreoScitex, Burnaby, British Columbia, Canada), and was exposed to 830 nm infrared laser radiation at a power of 12 W and a range of drum speeds from 210 to 50 rpm (corresponding to exposure energies ranging from 130 to 540 $mJ/cm^2$). The exposed precursor was subsequently developed in tap water to wash away unexposed areas of the coating. The resolution of the resulting image appeared to be at least 2 to 98% at 175 lines per inch, and the minimum exposure energy to achieve a good image was about 250 $mJ/cm^2$.

A second precursor, prepared similarly, was imaged at 250 $mJ/cm^2$ and then mounted directly on an A.B. Dick Press. The imaged precursor was developed in fountain solution to yield a printable plate. The plate printed at least 250 copies of good-quality prints.

Example 2B

A coating solution was prepared by combining 9.8 g of a 17 wt.-% aqueous solution of sulfated N-13 phenolic resin (from Example 1A), 35 g of water, 5 g of isopropyl alcohol, 0.4 g of IR Dye B, and 0.1 g of 10% LODYNE 103A.

An electrochemically grained and anodized aluminum substrate, post-treated with poly(vinylphosphonic acid) (PVPA), was mounted on a hot rotating drum. The substrate was then contacted with the coating solution, which was delivered to the substrate by a pumper, to yield a dry coating weight of about 0.86 $g/m^2$. The coated substrate was dried by blowing hot air at 150° F. for about 2 minutes over the substrate, to yield a printing plate precursor.

The resulting precursor was placed on a Creo TRENDSETTER 3244x image setter, and was exposed to 830 nm infrared laser radiation at an exposure energy of about 250 $mJ/cm^2$. The exposed precursor was then mounted directly on an A.B. Dick Press, and developed in fountain solution to yield a printable plate. The developed plate printed at least 250 copies of good quality prints.

Example 2C

A coating solution was prepared by combining 2.5 g of a 26.7 wt.-% aqueous solution of sulfated N-13 phenolic resin (from example 1B), 7.5 g of water, 0.075 g of IR Dye D and 0.02 g of 10% LODYNE 103A. An electrochemically grained and anodized aluminum substrate, post-treated with PVPA, was coated with the coating solution, by means of a wire-wound bar, to provide a dry coating weight of about 1.0 $g/m^2$. The coating was dried at 100° C. in a Ranar conveyor oven (Ranar Mfg. Co. Inc., El Segundo, Calif.) for about one minute.

The resulting precursor was placed on a Creo TRENDSETTER 3244x image setter and exposed to 830 nm infrared laser radiation at a power of 12 W and a range of drum speeds from 210 to 50 rpm (corresponding to exposure energies ranging from 130 to 550 $mJ/cm^2$). The exposed precursor was subsequently developed in tap water to wash away unexposed areas of the coating. The minimum exposure energy to achieve a good image was about 200 $mJ/cm^2$.

Example 2D

A coating solution was prepared by combining 13.5 g of 24.3 wt.-% aqueous solution of sulfated LB6564 phenolic resin (from example IC), 37.5 g of water, 0.25 g of IR Dye D and 0.1 g of 10% LODYNE 103A. An electrochemically grained and anodized aluminum substrate, post-treated with poly(vinylphosphonic acid) (PVPA), was mounted on a hot rotating drum. The substrate was then contacted with the coating solution, which was delivered to the substrate by a pumper, to yield a dry coating weight of about 0.86 $g/m^2$. The coated substrate was dried by blowing hot air at 150° F. for about 2 minutes over the substrate, to yield a printing plate precursor.

The resulting precursor was placed on a Creo TRENDSETTER 3244x image setter. The precursor was then exposed to 830 nm infrared laser radiation at a power of 12 W and a range of drum speeds from 250 to 60 rpm (corresponding to exposure energies ranging from 110 to 500 $mJ/cm^2$).

The exposed precursor was preheated in a Heavy Duty Oven (Wisconsin Oven Corp., East Troy, Wis.) at temperatures of 272° F. for about 2 minutes, and was subsequently developed in tap water to wash away unexposed areas of the coating. The resolution of the resulting image appeared to be at least 2 to 98% at 175 lines per inch, and the minimum exposure energy to achieve a good image was about 150 $mJ/cm^2$.

In a second experiment, the exposed precursor was developed in tap water without preheating, and the minimum exposure energy to obtain a good image without preheat was about 550 $mJ/cm^2$.

Example 2E

A coating solution was prepared by combining 3.3 g of 12.8 wt.-% aqueous solution of sulfated N-15 phenolic resin (from example 1D), 6.7 g of water, 0.075 g of IR Dye D and 0.02 g of 10% LODYNE 103A. An electrochemically grained and anodized aluminum substrate, post-treated with PVPA, was coated with the coating solution, by means of a wire-wound bar, to provide a dry coating weight of about 1.0 g $/m^2$. The coating was dried at 100° C. in a Ranar conveyor oven for about one minute.

The resulting precursor was placed on a Creo TRENDSETTER 3244x image setter. The precursor was then exposed to 830 nm infrared laser radiation at a power of 12 W and a range of drum speeds from 210 to 50 rpm (corresponding to exposure energies ranging from 130 to 550 $mJ/cm^2$).

The exposed precursor was preheated in a Heavy Duty Oven at a temperature of 290° F. for about 2 minutes, and was subsequently developed in tap water to wash away unexposed areas of the coating. The minimum exposure energy to achieve a good image was about 160 $mJ/cm^2$.

In a second experiment, the exposed precursor was developed in tap water without preheating, and the minimum exposure energy to obtain a good image without preheat was about 550 $mJ/cm^2$.

Example 2F

A coating solution was prepared by combining 2.86 g of 21 wt.-% aqueous solution of sulfated AP resin (from example 1E), 7.2 g of water, 0.05 g of IR Dye D and 0.01 g of 10% LODYNE 103A. An electrochemically grained and anodized aluminum substrate, post-treated with PVPA, was coated with the coating solution, by means of a wire-wound bar, to provide a dry coating weight of about 0.8 $g/m^2$. The resulting precursor was placed on a Creo TRENDSETTER 3244x image setter. The precursor was then exposed to 830 nm infrared laser radiation at a power of 12 W and a range of drum speeds from 250 to 60 rpm (corresponding to exposure energies ranging from 110 to 500 $mJ/cm^2$).

The exposed precursor was developed in tap water to wash away unexposed areas of the coating. The resolution of the resulting image appeared to be at least 5 to 97% at 175 lines per inch, and the minimum exposure energy to achieve a good image was about 400 $mJ/cm^2$.

Example 3

Preparation of Printing Plate Precursors and Imaged Printing Plates Having Imageable Coatings Comprising Water-Soluble Polyvinyl Pyrrolidone The following compositions are referred to throughout the Examples:

PVP K15—Polyvinyl pyrrolidone (m.w. ~6 kDa to ~15 kDa), supplied as a pale yellow aqueous solution having about 30% solids (ISP Technologies Inc., Wayne, N.J.).

PVP K30—Polyvinyl pyrrolidone (m.w. ~40 kDa to ~80 kDa), supplied as a solid (ISP Technologies Inc.).

PVP K60—Polyvinyl pyrrolidone (m.w. ~240 kDa to ~450 kDa), supplied as a yellow aqueous solution having about 49% solids (ISP Technologies Inc.).

PVP K90—Polyvinyl pyrrolidone (m.w. ~900 kDa to ~1500 kDa), supplied as a yellow aqueous solution having 21.6% solids (ISP Technologies Inc.).

Novolak A—An aqueous solution of a sulfated novolak resin prepared by the following method:

1) LB6564 resin (6 g, 0.05 mol) was dissolved in dimethylformamide (20 g).

2) $SO_3$-pyridine complex (4 g, 0.025 mol) and pyridine (2 g, 0.025 mol) was added, and the mixture was stirred at room temperature overnight.

3) 5 mL of 30% ammonium hydroxide was added, which caused an exothermic reaction and clouding of the solution. The resulting solution was stirred for 30 minutes. 100 mL tetrahydrofuran was added, and a precipitate formed.

4) The precipitate mixture was stirred for 30 seconds and then allowed to sit for 10 minutes. The tetrahydrofuran solvent was decanted off, and 10 mL acetone was added to wash the precipitate. The acetone was decanted off, and the precipitate was dried with flowing nitrogen.

5) Finally, the solid precipitate was dissolved in water to make a 15 wt.-% solution. The aqueous solution of sulfated novolak resin was maintained at a pH of about 7. In experiments similar to those described herein, if the pH was greater than about 8, or especially greater than about 9, the coating containing the sulfated novolak was observed to dissolve away during water development, regardless of exposure energy. Although a latent image could be seen in the imaged coating, both exposed and unexposed areas of the coating washed away.

On the other hand, if the pH of the novolak solution was less than 5, or especially less than 4, the sulfated novolak resin was apparently not stable in solution and decomposed or formed a precipitate. The same observation may apply for all sulfated phenolic resins described herein.

Using this method, theoretically 100% of the available hydroxyl groups on the phenolic resin starting material were converted to $—OSO_3^-(NH_4)^+$.

Novolak B—An aqueous solution (15 wt.-%) of a sulfated novolak resin prepared using the method for Novolak A, except that only 1.5 g (0.009 mol) $SO_3$-pyridine complex was used. Using this method, theoretically 37.5% of the available hydroxyl groups on the phenolic resin starting material were converted to $—OSO_3^-(NH_4)^+$.

Novolak C—An aqueous solution (15 wt.-%) of a sulfated novolak resin prepared using the method for Novolak A, except that only 2.0 g (0.013 mol) $SO_3$-pyridine complex was used. Using this method, theoretically 50% of the available hydroxyl groups on the phenolic resin starting material were converted to $—OSO_3^-(NH_4)^+$.

Novolak D—An aqueous solution (15 wt.-%) of a sulfated novolak resin prepared using the method for Novolak A, except that 5 mL of 30% KOH solution was used in place of ammonium hydroxide. Using this method, theoretically 100% of the available hydroxyl groups on the phenolic resin starting material were converted to $—OSO_3^-K^+$.

Novolak X—An aqueous solution (16.7 wt.-%) of a sulfated novolak resin prepared using the method for Novolak A, except that LB6564 was replaced with N-13 resin, and 3.0 g (0.019 mol) $SO_3$-pyridine complex was used. Using this method, theoretically 75% of the available hydroxyl groups on the phenolic resin starting material were converted to $—OSO_3^-(NH_4)^+$.

Novolak Y—An aqueous solution (16.5 wt.-%) of a sulfated novolak resin prepared using the method for novolak A, except that LB6564 resin was replaced with N-13 resin. Using this method, theoretically 100% of the available hydroxyl groups on the phenolic resin starting material were converted to $—OSO_3^-(NH_4)^+$.

Poly(vinyl alcohol) 88%—Polyvinyl alcohol (m.w. ~13 kDa to ~23 kDa), as supplied by Sigma-Aldrich Inc.

Poly(vinyl alcohol) 75%—Polyvinyl alcohol (m.w. ~9 kDa to ~10 kDa), having a MW in the range of about 9 kDa to about 10 kDa, as supplied by Sigma-Aldrich Inc.

Polyacrylamide—Polyacrylamide (m.w. ~10 kDa), as supplied by Sigma-Aldrich Inc.

Poly(acrylic acid)—Poly(acrylic acid) (m.w. ~2 kDa), as supplied by Sigma-Aldrich Inc.

Examples 3A and 3B

Coating formulations were prepared as aqueous solutions according to Table 1. A sufficient quantity of water was used to give a desired coating weight of about 1.5 $g/m^2$.

For each coating formulation, an electrochemically grained and anodized 0.3 gauge aluminum substrate, post-treated with PVPA, was coated with the coating formulation, by means of a wire-wound bar, to provide a dry coating weight of about 1.5 g/$m^2$.

TABLE 1

Coating formulations for Examples 3A and 3B.

| Component | Example 3A | Example 3B |
|---|---|---|
| | Parts by Weight (Dry) | |
| PVP K60 | 20 | 10 |
| Novolak A | 78 | 88 |
| IR Dye A | 2 | 2 |

The coating was dried at 100° C. for 10 minutes in a Mathis LABDRYER oven (Werner Mathis U.S.A. Inc., Concord, N.C.) to yield a printing plate precursor.

After the coating was permitted to age at room temperature for a period of 48 hours, the printing plate precursors were imagewise exposed with 830 nm infrared laser radiation, using an internal test pattern on a Creo 3230 TRENDSETTER (15.5 W laser power; 117, 100, 87, 77, and 70 rpm corresponding to 300, 350, 400, 450 and 500 mJ/$cm^2$). Latent images were observed.

The exposed precursors were then drenched in cold tap water for 20 seconds, rubbed with a wet cotton pad for a further 10 seconds, and then dried. The unexposed areas of the coatings were washed away, revealing the hydrophilic aluminum layer beneath. The optimum exposure energy for coating formulations 3A and 3B was observed to be 400 mJ/$cm^2$. The resolution of the plates at 400 mJ/$cm^2$ appeared to be at least 2 to 98% at 150 lines per inch.

The printing plate of Example 3A was inked by hand using a wet rag with printing ink applied. The ink preferentially stuck to the green coating of the plate. Water was retained on the aluminum substrate.

Example 3A was twice repeated, except that the coating was dried for 1 minute and 3 minutes, respectively, in the oven. In both cases, results were the same as those indicated for Example 3A.

Example 3A was repeated twice more, except that the time period that was permitted to elapse between coating and imaging was changed to 24 hours and 72 hours, respectively. The precursor aged for 72 hours produced the same result as above. The precursor aged for only 24 hours, however, did not achieve 2 to 98% resolution at 400 mJ/$cm^2$ imaging exposure. For this precursor, much of the exposed region of the coating dissolved away in the tap water.

Comparative Example 3C

A coating formulation was prepared as an aqueous solution according to Table 2. A sufficient quantity of water was used to give a desired coating weight of about 1.5 g/$m^2$.

TABLE 2

Coating formulation for Comparative Example 3C.

| Component | Parts by Weight (Dry) |
|---|---|
| PVP K15 | 20 |
| Novolak A | 78 |
| IR Dye A | 2 |

A substrate was coated as for Example 3A. The coating was dried at 100° C. for 10 minutes in the oven, to yield a printing plate precursor.

After the coating was permitted to age at room temperature for a period of 48 hours, the precursor was imagewise exposed as described for Example 3A. A latent image was observed. On developing with water, both exposed and unexposed areas of the coating were washed away. This Comparative Example demonstrates that a water-soluble binder having low molecular weight may not provide sufficient resistance to water or a liquid developer to make a useful imageable coating.

Example 3D

A coating formulation was prepared as an aqueous solution according to Table 3. A sufficient quantity of water was used to give a desired coating weight of about 1.5 g/$m^2$.

TABLE 3

Coating formulation for Example 3D.

| Component | Parts by Weight (Dry) |
|---|---|
| PVP K60 | 20 |
| Novolak A | 78 |
| IR Dye B | 2 |

A substrate was coated as for Example 3A. The coating was dried at 100° C. for 10 minutes in the oven, to yield a printing plate precursor.

After the coating was permitted to age at room temperature for a period of 48 hours, the printing plate precursor was imagewise exposed as described for Example 3A. A latent image was observed.

The exposed precursor was then drenched in cold tap water for 20 seconds, rubbed with a wet cotton pad for a further 10 seconds, and dried. An image was developed. The optimum exposure energy appeared to be 450 mJ/$cm^2$.

Examples 3E to 3H

Coating formulations were prepared as aqueous solutions according to Table 4. A sufficient quantity of water was used to give a desired coating weight of about 1.5 g/$m^2$.

TABLE 4

Coating formulations for Examples 3E to 3H.

| Component | Example 3E | 3F | 3G | 3H |
|---|---|---|---|---|
| | Parts by Weight (Dry) | | | |
| PVP K60 | 20 | 20 | 10 | 10 |
| Novolak B | 78 | | 88 | |
| Novolak C | | 78 | | 88 |
| IR Dye A | 2 | 2 | 2 | 2 |

For each formulation, a substrate was coated as for Example 3A. The coating was dried at 100° C. for 3 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then water-developed as for Example 3A. The unexposed areas of the coatings were washed away, revealing the hydrophilic aluminum layer beneath. For Examples 3F and 3H, 450 mJ/$cm^2$ appeared to be the optimum exposure energy. For examples 3E and 3G, the optimum exposure energy appeared to be 500 mJ/$cm^2$.

Each of Examples 3E to 3H were repeated, except that period that was permitted to elapse between coating and imaging was changed to 96 hours. After exposing and developing, the results were the same as for the respective Examples 3E to 3H.

Examples 31 to 3K

Coating formulations were prepared as aqueous solutions according to Table 5. A sufficient quantity of water was used to give a desired coating weight of about 1.5 g/m$^2$.

TABLE 5

Coating formulations for Examples 3I to 3K.

| Component | 3I | 3J | 3K |
|---|---|---|---|
| | Parts by Weight (Dry) | | |
| PVP K60 | | | 20 |
| PVP K30 | 20 | 20 | |
| Novolak D | 77 | 77 | 77 |
| IR Dye A | 3 | | |
| IR Dye C | | 3 | 3 |

For each formulation, a substrate was coated as for Example 3A. The coating was dried at 100° C. for 3 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then water-developed as for Example 3A. The unexposed areas of the coatings were washed away, revealing the hydrophilic aluminum layer beneath. The optimum exposure energy appeared to be 550 mJ/cm$^2$ for each.

Examples 3L, 3M, Comparative Example 3N, and Examples 3O to 3Q

Coating formulations were prepared as aqueous solutions according to Table 6. A sufficient quantity of water was used to give a desired coating weight of about 1.5 g/m$^2$.

TABLE 6

Coating formulations for Examples 3L to 3Q.

| Component | 3L | 3M | C - 3N | 3O | 3P | 3Q |
|---|---|---|---|---|---|---|
| | Parts by Weight (Dry) | | | | | |
| PVP K60 | 10 | 20 | | | 20 | 20 |
| PVP K30 | | | | 20 | | |
| Novolak A | 87 | 77 | 97 | 77 | 74 | 70 |
| IR Dye A | 3 | 3 | 3 | 3 | 6 | 10 |

For each formulation, a substrate was coated as for Example 3A. The coating was dried at 100° C. for 3 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then water-developed as for Example 3A. The unexposed areas of the coatings were washed away, revealing the hydrophilic aluminum layer beneath. For Examples 3L and 3P, the optimum exposure energy was 400 mJ/cm$^2$. For Examples 3M and 3Q, the optimum exposure energy was 450 mJ/cm$^2$. For Example 30 the optimum exposure energy was 350 mJ/cm$^2$. Finally for Comparative Example 3N, no optimum exposure environment was found, and the imaged precursor did not develop completely in water.

Example 4

Preparation of Printing Plate Precursors and Imaged Printing Plates Having Imageable Coatings Comprising Water-Soluble Binders Example 4A to 4E Coating formulations were prepared as aqueous solutions according to Table 7. A sufficient quantity of water was used to give a desired coating weight of about 1.5 g/m$^2$.

TABLE 7

Coating formulations for Examples 4A to 4E.

| Component | 4A | 4B | 4C | 4D | 4E |
|---|---|---|---|---|---|
| | Parts by Weight (Dry) | | | | |
| PVP K60 | 5 | | | 10 | 20 |
| PVP K30 | | 10 | 5 | | |
| Novolak A | 92 | 87 | 92 | 86.5 | 76.5 |
| LODYNE 103A | | | | 0.5 | 0.5 |
| IR Dye A | 3 | 3 | 3 | 3 | 3 |

For each formulation, a substrate was coated as for Example 3A. The coating was dried at 100° C. for 10 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then drenched in cold tap water for 20 seconds, rubbed with a wet cotton pad for a further 10 seconds, and dried. The unexposed areas of the coatings were washed away, revealing the hydrophilic aluminum layer beneath. For Example 4A, the optimum exposure energy was 300 mJ/cm$^2$. For Examples 4B and 4C, the optimum exposure energy was 350 mJ/cm$^2$. For Example 4D, the optimum exposure energy was 400 mJ/cm$^2$. For Example 4E, the optimum exposure energy was 450 mJ/cm$^2$.

Examples 4F to 4H, Comparative Example 41, and Examples 4J to 4L

Coating formulations were prepared as aqueous solutions according to Table 8. A sufficient quantity of water was used to give a desired coating weight of about 1.5 g/m$^2$.

TABLE 8

Coating formulations for Examples 4F to 4L.

| Component | 4F | 4G | 4H | C - 4I | 4J | 4K | 4L |
|---|---|---|---|---|---|---|---|
| | Parts by Weight (Dry) | | | | | | |
| PVP K60 | 5 | | 10 | | 20 | 10 | 5 |
| Novolak X | 92 | | | | | | |
| IR Dye A | 3 | 3 | 3 | 3 | 3 | 3 | 3 |
| Novolak A | | 92 | 87 | 97 | | | |

TABLE 8-continued

| Coating formulations for Examples 4F to 4L. | | | | | | | |
|---|---|---|---|---|---|---|---|
| | Example | | | | | | |
| Component | 4F | 4G | 4H | C - 4I | 4J | 4K | 4L |
| | Parts by Weight (Dry) | | | | | | |
| PVP K90 | | 5 | | | | | |
| Novolak Y | | | | | 77 | 87 | 92 |

For each formulation, a substrate was coated as for Example 3A. The coating was dried at 100° C. for 10 minutes in the oven, to yield a printing plate precursor.

For Examples 4F, 4G, 4J, 4K and 4L, after the coating was permitted to age at room temperature for a period of 48 hours, the printing plate precursors were imagewise exposed as described for Example 3A. Latent images were observed.

The exposed precursors were then drenched in cold tap water for 20 seconds, rubbed with a wet cotton pad for a further 10 seconds, and dried. The unexposed areas of the coatings were washed away, revealing the hydrophilic aluminum layer beneath. For Example 4F, the optimum exposure energy was 500 mJ/cm$^2$. For Examples 4G and 4L, the optimum exposure energy was 300 mJ/cm$^2$. For Examples 4J and 4K, the optimum exposure energy was 350 mJ/cm$^2$.

For Example 4H and Comparative Example 4I, the coating was not permitted to age prior to imaging, and the printing plate precursors were imagewise exposed as described for Example 3A. Latent images were observed. The exposed precursors were then drenched in cold tap water for 20 seconds, rubbed with a wet cotton pad for a further 10 seconds, and dried. The unexposed areas of the coatings were washed away, revealing the hydrophilic aluminum layer beneath.

The imaged printing plate for Example 4H was mounted on the A.B. Dick Press. It printed at least 250 good-quality impressions.

The imaged printing plate for Comparative Example 4I was next mounted on the A.B. Dick Press. When ink and fountain solution were applied to the plate surface, the coating dissolved away in the fountain solution, leaving no image from which an impression could be made.

Examples 4M to 4Q

Coating formulations were prepared as aqueous solutions according to Table 9. A sufficient quantity of water was used to give a desired coating weight of about 1.5 g/m$^2$.

TABLE 9

| Coating formulations for Examples 4M to 4Q. | | | | | |
|---|---|---|---|---|---|
| | Example | | | | |
| Component | 4M | 4N | 4O | 4P | 4Q |
| | Parts by Weight (Dry) | | | | |
| PVP K60 | 5 | 5 | 5 | 5 | 5 |
| Novolak A | 89 | 86 | 92 | 89 | 86 |
| IR Dye A | 6 | 9 | | | |
| IR Dye D | | | 3 | 6 | 9 |

For each formulation, a substrate was coated as for Example 3A. The coating was dried at 100° C. for 10 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then drenched in cold tap water for 20 seconds, rubbed with a wet cotton pad for a further 10 seconds, and dried. The unexposed areas of the coatings were washed away, revealing the hydrophilic aluminum layer beneath. For Examples 4M and 4N, the optimum exposure energy was 250 mJ/cm$^2$. For Examples 4O and 4P, the optimum exposure energy was 400 mJ/cm$^2$. For Example 4Q, the optimum exposure energy was 300 mJ/cm$^2$.

Example 4R and Comparative Example 4S

Coating formulations were prepared as aqueous solutions according to Table 10. A sufficient quantity of water was used to give a desired coating weight of about 1.5 g/m$^2$.

TABLE 10

| Coating formulations for Example 4R and Comparative Example 4S. | | |
|---|---|---|
| | Example | |
| Component | 4R | C - 4S |
| | Parts by Weight (Dry) | |
| PVP K60 | 5 | |
| Novolak A | 92 | 97 |
| IR Dye E | 3 | 3 |

For each formulation, a substrate was coated as for Example 3A. The coating was dried at 100° C. for 10 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then drenched in cold tap water for 20 seconds, rubbed with a wet cotton pad for a further 10 seconds, and dried. The unexposed areas of the coatings were washed away, revealing the hydrophilic aluminum layer beneath. For Example R, the optimum exposure energy was 350 mJ/cm$^2$. For Comparative Example S, no optimum exposure environment was found, and the plate did not develop completely in water.

Examples 4T to 4W

Coating formulations were prepared as aqueous solutions according to Table 11. A sufficient quantity of water was used to give a desired coating weight of about 1.5 g/m$^2$.

TABLE 11

| Coating formulations for Examples 4T to 4W. | | | | |
|---|---|---|---|---|
| | Example | | | |
| Component | 4T | 4U | 4V | 4W |
| | Parts by Weight (Dry) | | | |
| Poly(vinyl alcohol) 88% | 5 | | | |
| Poly(vinyl alcohol) 75% | | 5 | | |
| Polyacrylamide | | | 5 | |
| Poly(acrylic acid) | | | | 5 |
| Novolak A | 92 | 92 | 92 | 92 |
| IR dye A | 3 | 3 | 3 | 3 |

For each formulation, a substrate was coated as for Example 3A. The coating was dried at 100° C. for 10 minutes in the oven, to yield a printing plate precursor.

After the coating was permitted to age at room temperature for a period of 48 hours, the printing plate precursors were imagewise exposed as described for Example 3A. Latent images were observed.

The exposed precursors were then drenched in cold tap water for 20 seconds, rubbed with a wet cotton pad for a further 10 seconds, and dried. The unexposed areas of the coatings were washed away, revealing the hydrophilic aluminum layer beneath. For each of Examples 4T to 4W, optimum exposure energy was 400 mJ/cm$^2$.

This invention may take on various modifications and alterations without departing from the spirit and scope thereof. Accordingly, it is to be understood that this invention is not to be limited to the above-described, but it is to be controlled by the limitations set forth in the following claims and any equivalents thereof. It is also to be understood that this invention may be suitably practiced in the absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

What is claimed is:

1. A printing plate precursor comprising:

a substrate; and an imageable coating on the substrate, the imageable coating comprising a sulfated phenolic resin having an average molecular weight in the range of about 1 kDa to about 500 kDa.

2. The printing plate precursor of claim 1, wherein the substrate includes an oleophobic surface that is in contact with the imageable coating.

3. The printing plate precursor of claim 1, wherein the substrate includes a hydrophilic surface that is in contact with the imageable coating.

4. The printing plate precursor of claim 1, wherein the substrate is hydrophilic aluminum sheet.

5. The printing plate precursor of claim 1, wherein at least about 50% by weight of the imageable coating is the sulfated phenolic resin.

6. The printing plate precursor of claim 1, wherein the sulfated phenolic resin comprises a resin selected from the group consisting of sulfated novolak re and sulfated resole resins.

7. The printing plate precursor of claim 1, wherein the sulfated phenolic resin includes units having the structure A and units having the structure B

A

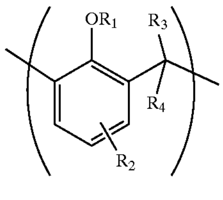

B

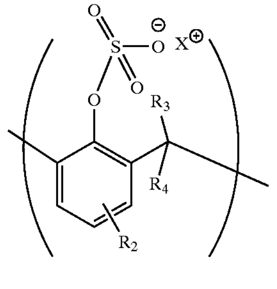

wherein substituents $R_1$, $R_2$, $R_3$, and $R_4$ are independently selected from the group consisting of hydrogen, alkyl, alkenyl, alkynyl, aryl, alkaryl, or aralkyl;

$X^{\oplus}$ represents a positively charged counterion; and the ratio m is defined as the number of B units to the sum of the number of A units plus the number of B units, and m in the range from about 0.25 to 1.0.

8. The printing plate precursor of claim 7, wherein is greater than about 0.5.

9. The printing plate precursor of claim 7, wherein $X^{\oplus}$ represents a positive ion selected from the group consisting of lithium ion, potassium ion, and sodium ion.

10. The printing plate precursor of claim 7, wherein $X^{\oplus}$ represents a positive ion selected from the group consisting of ammonium, alkylammonium, aryl ammonium, cyclic ammonium, pyrrolidinium, pyridinium, diazonium, sulfonium, and iodonium.

11. The printing plate precursor of claim 7, wherein $X^{\oplus}$ is ammonium.

12. The printing plate precursor of claim 1, wherein the imageable coating is soluble in water.

13. The printing plate precursor of claim 1, wherein the imageable coating comprises a radiation-absorbing component.

14. The printing plate precursor of claim 13, wherein the radiation-absorbing component comprises a pigment.

15. The printing plate precursor of claim 13, wherein the radiation-absorbing component comprises one of the group consisting of carbon black, Heliogen Green, Nigrosine Base, iron (III) oxide, manganese oxide, Prussian blue, Paris blue.

16. The printing plate precursor of claim 13, wherein the radiation-absorbing component includes a dye.

17. The printing plate precursor of claim 13, wherein the radiation-absorbing component includes an infrared-absorbing dye.

18. The printing plate precursor of claim 13, wherein the radiation-absorbing component includes a dye selected from the group consisting of cyanine dyes, squarylium dyes, and oxonol dyes.

19. The printing plate precursor of claim 1, wherein the imageable coating comprises a binder selected from the group consisting of polyvinyl pyrrolidone, polyvinyl alcohol, polyacrylamide, polyacrylic acid, polyvinylimidazole, polyethyleneimine, poly (ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose, anti carboxymethylcellulose.

20. The printing plate precursor of claim 1, wherein the imageable coating comprises a polymeric binder.

21. The printing plate precursor of claim 20, wherein the binder is polyvinyl pyrrolidone having a molecular weight in the range of about 40 kDa to about 1500 kDa.

22. The printing plate precursor of claim 20, wherein not more than about 30% by weight of the imageable coating is the binder.

23. A method of making a printing plate precursor having an imageable coating on a substrate, the method comprising:

applying to the substrate a composition comprising a solvent and a sulfated phenolic resin dispersed in the solvent, the sulfated phenolic resin having an average molecular weight in the range of about 1 kDa to about 500 kDa; and removing at least some of the solvent to leave an imageable coating on the substrate, to obtain the printing plate precursor.

24. The method of claim 23, wherein the solvent comprises water and the composition is neutral or basic.

25. The method of claim 23, wherein the solvent is water that is free from organic solvents.

26. The method of claim 23, wherein the sulfated phenolic resin comprises a resin selected from the group consisting of sulfated novolak resins and sulfated resole resins.

27. The method of claim 23, wherein the sulfated phenolic resin includes units having the structure A and units having the structure B,

A

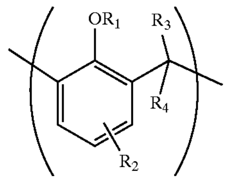

B

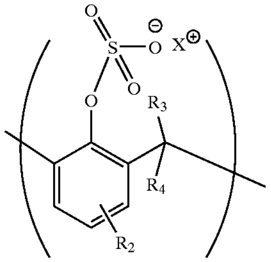

wherein substituents $R_1$, $R_2$, $R_3$, and $R_4$ are independently selected from the group consisting of hydrogen, alkyl, alkenyl, alkynyl, aryl, alkaryl, or aralkyl;

$X^{\oplus}$ represents a positively charged counterion; and the ratio m is defined as the number of B units to the sum of then number of A units plus the number of B units, and m in the range from about 0.25 to 1.0.

28. The method of claim 27, wherein m is greater than about 0.5.

29. The method of claim 27, wherein $X^{\oplus}$ represents a positive ion selected from the group consisting of lithium ion, potassium ion, and sodium ion.

30. The method of claim 27, wherein $X^{\oplus}$ represents a positive ion selected from the group consisting of ammonium, alkylammonium, aryl ammonium, cyclic ammonium, pyrrolidinium, pyridinium, diazonium, sulfonium, and iodonium.

31. The method of claim 27, wherein $X^{\oplus}$ is ammonium.

32. The method of claim 23, wherein the composition includes a binder selected from the group consisting of polyvinyl pyrrolidone, polyvinyl alcohol, polyacrylamide, polyacrylic acid, polyvinylimidazole, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose, and carboxymethylcellulose.

33. The method of claim 23, wherein the composition includes a polymeric binder.

34. The method of claim 33, wherein the binder is a water-soluble polymer and the solvent comprises water.

35. The method of claim 33, wherein the binder is polyvinyl pyrrolidone having a molecular weight in the range of about 40 kDa to about 1500 kDa.

36. The method of claim 23 wherein the composition includes a radiation-absorbing component.

37. The method of claim 36 wherein the radiation-absorbing component comprises a pigment.

38. The method of claim 36, wherein the radiation-absorbing component comprises one of the group consisting of carbon black, Heliogen Green, Nigrosine Base, iron (III) oxide, manganese oxide, Prussian blue, Paris blue.

39. The method of claim 36 wherein the radiation-absorbing component includes a dye.

40. The method of claim 36, wherein the radiation-absorbing component is an infrared-absorbing dye.

41. The method of claim 36 wherein the radiation-absorbing component includes a dye selected from the group consisting of cyanine dyes, squarylium dyes, an oxonol dyes.

42. The method of claim 23, wherein the solvent comprises water and the composition includes a water-soluble dye.

43. The method of claim 23 wherein the step of removing solvent includes heating the substrate and the composition to evaporate at least some of the solvent.

44. The method of claim 23 wherein the imageable coating is soluble in water.

45. A method of making an imaged printing plate having ink-receptive image areas, the method comprising:

applying to the substrate a composition comprising a solvent and a sulfated phenolic resin dispersed in the solvent, the sulfated phenolic resin having an average molecular weight in the range of about 1 kDa to a out 500 kDa;

removing at least some of the solvent to leave an imageable coating on the substrate;

imagewise exposing the coating to imaging radiation to produce exposed areas and unexposed areas of the coating; and contacting the coating with a liquid developer to remove unexposed areas of the coating, while having exposed areas as ink-receptive image areas, to yield the imaged printing plate.

46. The method of claim 45 wherein the substrate includes an oleophobic surface that is covered with the imageable coating prior to imagewise exposure, and that becomes uncovered in areas from which the unexposed areas of the coating are removed.

47. The method of claim 45 wherein the substrate includes a hydrophilic surface that is covered with the imageable coating prior to imagewise exposure, and that becomes uncovered in areas from which the unexposed areas of the coating are removed.

48. The method of claim 45 including the step of aging the imageable coating for at least about two days before imagewise exposing the coating.

49. The method of claim 45 wherein the imaging radiation includes infrared radiation.

50. The method of claim 45 wherein the composition includes a dye that is sensitive to the imaging radiation.

51. The method of claim 50, wherein the dye is selected from the group consisting of cyanine dyes, squarylium dyes, and oxonol dyes.

52. The method of claim 45, including the step of heating both exposed areas and unexposed areas of the coating before contacting the coating with a liquid developer.

53. The method of claim 45, wherein the liquid developer comprises water.

54. The method of claim 45, wherein the liquid developer is water.

55. The method of claim 45, wherein a period of at least about two days is permitted to elapse after imagewise exposing the coating and before contacting the coating with a liquid developer.

56. The method of claim 45, wherein the liquid developer is a fountain solution/ink dispersion, and the step of contacting the coating with the liquid developer is done on-press.

57. A composition comprising a sulfated phenolic resin having an average molecular weight in the range of about 1 kDa to about 500 kDa.

58. The composition of claim 57, wherein the sulfated phenolic resin includes units having the structure A and units having the structure B,

A

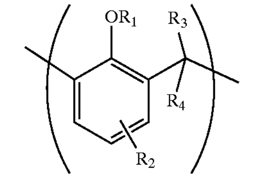

B

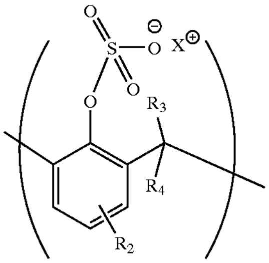

wherein substituents $R_1$, $R_2$, $R_3$, and $R_4$ and independently selected from the group consisting of hydrogen, alkyl, alkenyl, alkynyl, aryl, alkaryl, or aralkyl;

$X^{\oplus}$ represents a positively charged counterion; and the ratio m is defined as the number of B units to the sum of then number of A units plus the number of B units, and m in the range from about 0.25 to 1.0.

59. The composition of claim 58, wherein m is greater than about 0.5.

60. The composition of claim 58, wherein $X^{\oplus}$ is selected from the group consisting of lithium ion, potassium ion, and sodium ion.

61. The composition of claim 58, wherein $X^{\oplus}$ is selected from the group consisting of ammonium, alkylammonium, aryl ammonium, cyclic ammonium, pyrrolidinium, pyridinium, diazonium, sulfonium, and iodonium.

62. The composition of claim 58, wherein $X^{\oplus}$ is ammonium.

63. The composition of claim 57, wherein the sulfated phenolic resin is characterized by an average molecular weight of about 1 kDa to about 500 kDa.

64. The composition of claim 57, wherein the composition is water-soluble.

65. The composition of claim 57, wherein the composition consists essentially of the sulfated phenolic resin.

66. The composition of claim 57, comprising a radiation-absorbing component, and wherein the composition is thermally sensitive.

67. The composition of claim 66, further comprising a polymeric binder.

* * * * *